United States Patent [19]
Lee

[11] Patent Number: 5,864,260
[45] Date of Patent: Jan. 26, 1999

[54] MONOLITHIC SAW DUPLEXER

[75] Inventor: Albert A. Lee, Suwon-si, Rep. of Korea

[73] Assignee: Samsung Electro-Mechanics Co., Ltd., Suwon, Rep. of Korea

[21] Appl. No.: 761,861

[22] Filed: Dec. 9, 1996

[30] Foreign Application Priority Data

May 10, 1996 [KR] Rep. of Korea ................. 1996-15427

[51] Int. Cl.$^6$ ............................................. H03H 9/72
[52] U.S. Cl. ........................................... 333/133; 333/193
[58] Field of Search ........................... 333/133, 193–196; 310/313 R, 313 B, 313 C, 313 D

[56] References Cited

U.S. PATENT DOCUMENTS

| | | | |
|---|---|---|---|
| 4,792,939 | 12/1988 | Hikita et al. ................................ | 370/24 |
| 5,202,652 | 4/1993 | Tabuchi et al. ...................... | 333/133 X |
| 5,473,295 | 12/1995 | Turunen ............................... | 333/193 X |
| 5,515,015 | 5/1996 | Nakata ................................ | 333/193 X |
| 5,726,610 | 3/1998 | Allen et al. .......................... | 333/193 X |

FOREIGN PATENT DOCUMENTS

| | | | |
|---|---|---|---|
| 57-84607 A | 5/1982 | Japan | 333/194 |
| 61-70813 A | 4/1986 | Japan | 333/133 |
| 3-145320 A | 6/1991 | Japan | 333/193 |
| 5-299969 A | 11/1993 | Japan | 333/193 |
| 6-6111 | 1/1994 | Japan . | |

*Primary Examiner*—Benny Lee
*Assistant Examiner*—Barbara Summons
*Attorney, Agent, or Firm*—Ladas & Parry

[57] ABSTRACT

A monolithic SAW (surface acoustic wave) duplexer is disclosed. A transmitting bonding pad, a transmitting resonator, a microstrip line, an input/output bonding pad, a band pass filter, a receiving resonator, a receiving bonding pad, a ground bonding pad and a ground pattern are formed upon a single piezo-electric substrate through a single process.

5 Claims, 10 Drawing Sheets

MONOLITHIC SAW DUPLEXER

FIELD OF THE INVENTION

The present invention relates to a monolithic SAW (surface acoustic wave) duplexer. In particular, the present invention relates to a monolithic SAW duplexer in which transmitting and receiving SAW filters, a reception signal removing microstrip line and a transmission signal removing SAW filter are formed upon a piezo-electric substrate within a single chip.

DESCRIPTION OF THE PRIOR ART

Generally in a wireless communication system, a single antenna is commonly used for transmission and reception. For this purpose, a duplexer is used, so that a receiving apparatus can be protected from a transmitted output when transmitting, and that echo signals can be supplied to the receiving apparatus when receiving. The duplexer basically includes a receiving side band pass filter and a transmitting side band pass filter.

Figure 1:
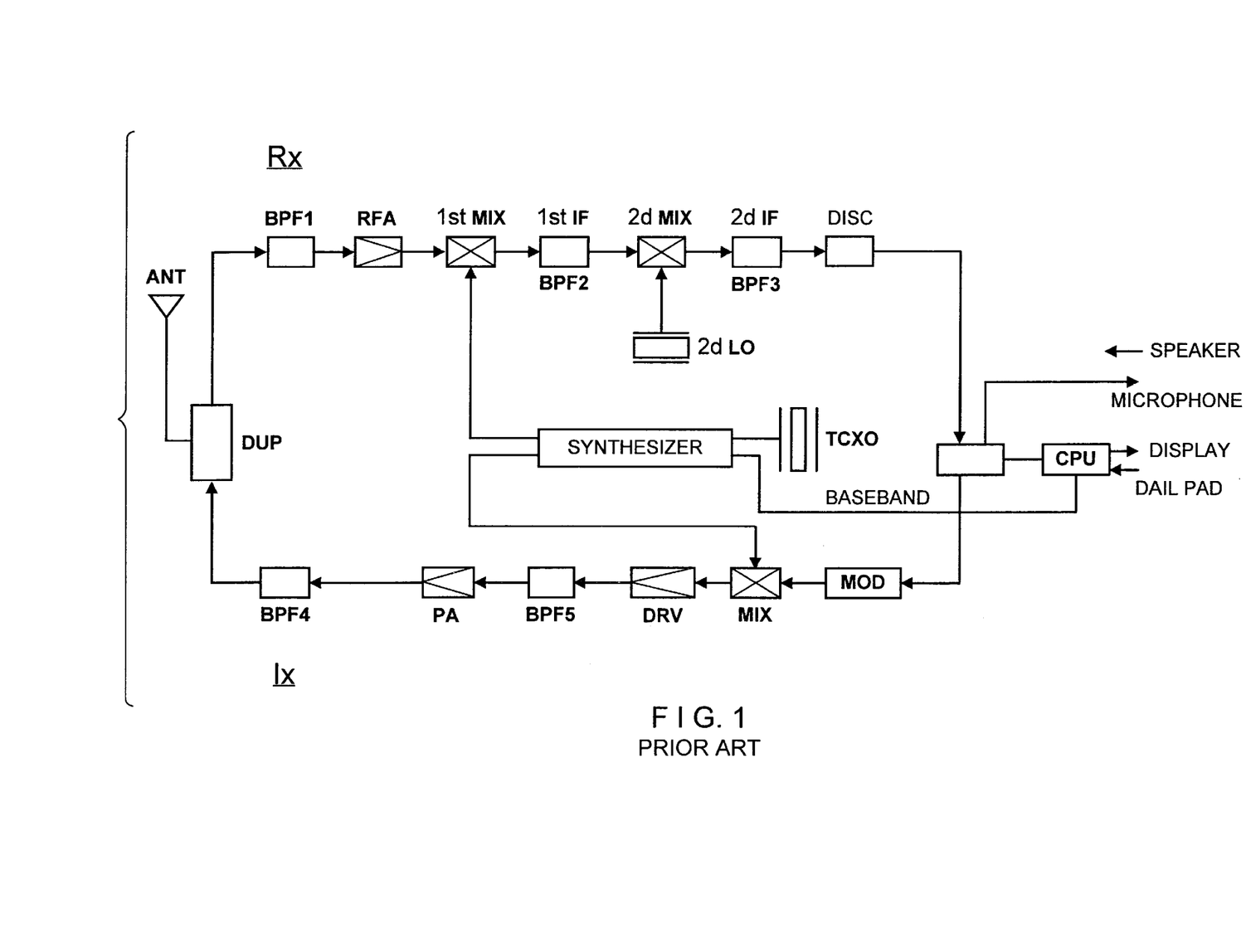
FIG. 1 is a block diagram showing the constitution of the general portable communicating system.

Generally in a wireless communication system as shown in FIG. 1, in order to use one antenna for transmission and reception, there is used a duplexer which includes a transmitting filter, a receiving filter and a matching circuit at an antenna terminal. The reception signals which are received to the antenna are supplied through the duplexer to a receiving device Rx so as to pass through a band pass filter BPF1 and a receiving amplifier RFA. Then the signals are converted to an intermediate frequency, are demodulated by a detector DISC, and are converted to base band signals by a base band processing section. Then the signals are outputted to a speaker, or are outputted as data by a central processing unit CPU, before being displayed.

Further, the signals which are supplied from a microphone or a dial pad are modulated by a modulating section MOD, and are mixed by a mixer MIX with the signals which are outputted from a transmitting local oscillator TCXO. The signals which are outputted from the mixer MIX pass through a transmitting amplifier DRV, a band pass filter BPF5, a power amplifier and a band pass filter BPF4 to be inputted into the duplexer DUP. The duplexer DUP does not output the signals to the receiving device Rx but radiates them into the air through the antenna.

Thus the duplexer DUP protects the receiving device Rx from the transmission output when transmitting signals, and supplies echo signals to the receiving device Rx when receiving signals. For this purpose, the duplexer basically includes a receiving side band pass filter and a transmitting side band pass filter.

In the duplexer which is used in a mobile communication system such as portable phone, mobile phone and the like, a dielectric filter is generally used. However, the dielectric filter has a large bulk, and therefore, it is unsuitable for the mobile communication system in which the trend is compactness and light weight. Therefore, there is an urgent demand for a compact filter in place of the dielectric filter.

The SAW filter can be manufactured in a small size e.g., 3×3 mm), and therefore, it can replace the dielectric filter.

One example of using the SAW filter is found in Japanese Patent Laid-open No. Hei-6-6111. In this case, however, the receiving side filter consists of a SAW filter, but the transmitting side filter consists of the conventional dielectric filter. Therefore, the apparatus is insufficient for achieving compactness and light weight.

Figure 2:
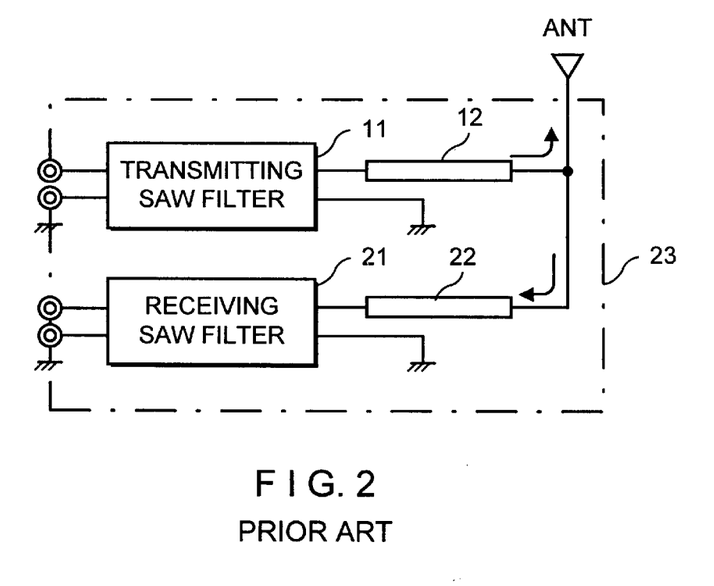
FIG. 2 illustrates a conventional duplexer in which the transmitting and receiving filters consist of SAW filters.

FIG. 2 illustrates a conventional duplexer in which both the transmitting and receiving filters consist of SAW filters.

Referring to FIG. 2, a transmitting SAW filter 11, a receiving SAW filter 21 (separated from each other), and two separate microstrip lines 12 and 22 are formed upon a single circuit board 23. Thus the structure is packed into a single package, and is connected to an antenna.

The microstrip lines 12 and 22 function as notch filters, and thus, the microstrip line 12 blocks the flow of the reception signals from the antenna to the transmitting section, while the microstrip 22 blocks the flow of high power transmission signals from a power amplifier of the transmitting device to the receiving device.

In the above described SAW duplexer in which the trackage contains the two SAW filter chips and the two microstrip lines, the microstrip lines cannot perform sufficient functions for separating the input/output signals. Therefore, the high power transmission signals cannot be sufficiently prevented from being returned to the receiving section. Further, it gives influence to the weak reception signals, and therefore, the signal-to-noise ratio is lowered, with the result that the reception sensitivity is aggravated, or in a worse case, the receiving becomes impossible.

Further, since a plurality of separate elements are packed into a single package, the manufacturing process becomes complicated as well as increasing the manufacturing cost. Further, the bulk of the duplexer is increased compared with a duplexer of a single chip.

SUMMARY OF THE INVENTION

The present invention is intended to overcome the above described disadvantages of the conventional techniques.

Therefore it is an object of the present invention to provide a monolithic SAW duplexer in which transmitting and receiving filters, auxiliary filters and strip lines are formed by a SAW device, thereby improving the separating characteristics of the transmission and reception signals.

It is another object of the present invention to provide a monolithic SAW duplexer in which transmitting and receiving filters, auxiliary filters and strip lines are formed by a SAW device upon a single substrate, thereby compacting the duplexer into a single chip through a single process.

It is still another object of the present invention to provide a monolithic SAW duplexer in which transmitting and receiving filters, auxiliary filters and strip lines are formed through a single process.

In achieving the above objects, the monolithic SAW duplexer according to the present invention includes: a piezo-electric substrate; transmitting and receiving filters formed into SAW devices upon the piezo-electric substrate; a strip line for allowing pass-through of signals of a frequency band of the transmitting filter so as to output the signals to an antenna; a transmission signal removing filter formed into a SAW device for allowing pass-through of signals of a receiving band to remove the transmission signals before outputting the signals to the receiving filter; and a sound absorbing member installed between the transmitting filter and the receiving filter, for removing surface acoustic waves propagated between them.

Further, a mask is prepared for forming a transmission bonding pad, a transmitting resonator, a microstrip line, an input/output bonding pad, a band pass filter, a receiving resonator, a receiving bonding pad, a ground bonding pad and a ground pattern upon a piezo-electric substrate. This mask is used, and a manufacturing technique for the monolithic SAW device is used, so that the monolithic SAW duplexer can be manufactured through a single process.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENT

Figure 3:
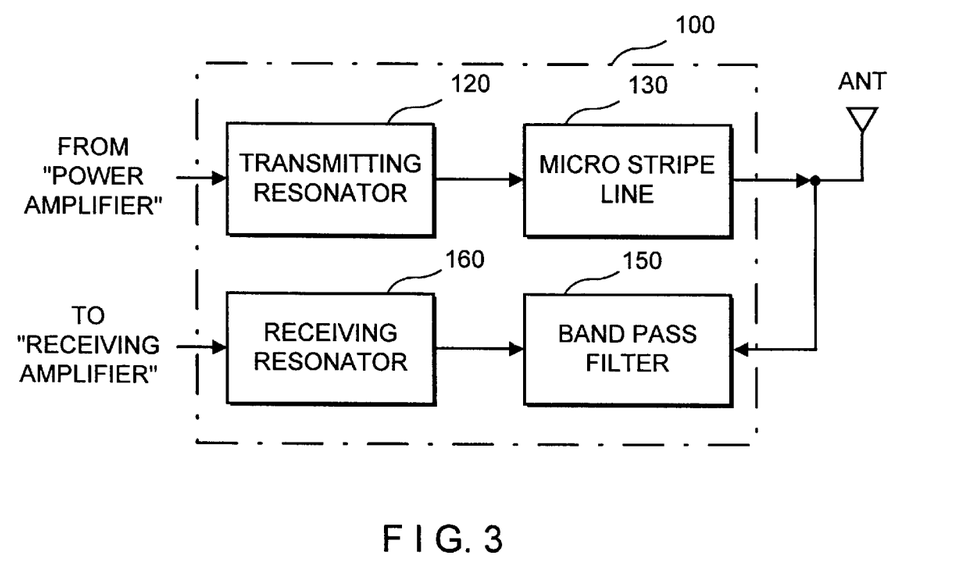
FIG. 3 is a partial block diagram showing the constitution of the monolithic SAW duplexer according to the present invention.

FIG. 3 is a partial block diagram showing the constitution of the monolithic SAW duplexer according to the present invention.

The monolithic SAW duplexer according to the present invention includes: a piezo-electric substrate 100; transmitting and receiving filters 120 and 160 formed by SAW devices upon the piezo-electric substrate 100; a microstrip line 130 for allowing pass-through of signals of a frequency band of the transmitting filter so as to output the signals to an antenna ANT; and a transmission signal removing filter 150 formed by a SAW device for allowing pass-through of signals of a receiving band to remove the transmission signals before outputting the signals to the receiving filter.

Figure 4:
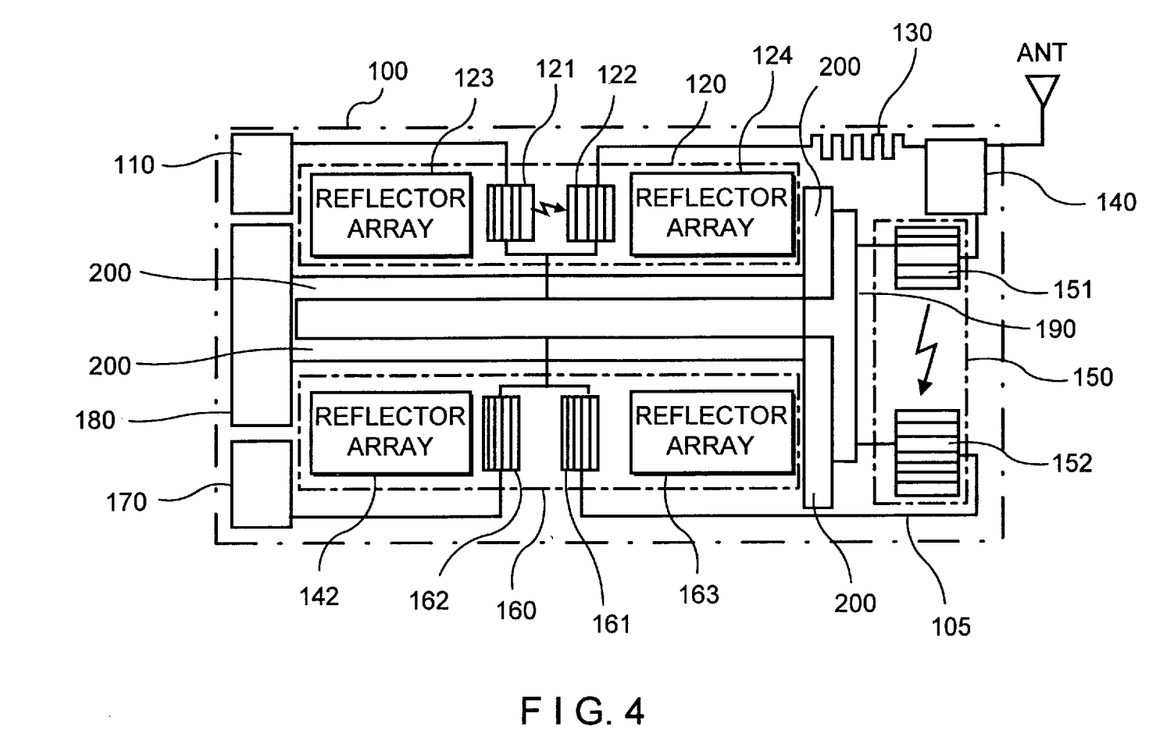
FIG. 4 illustrates an embodiment of the monolithic SAW duplexer according to the present invention.

FIG. 4 illustrates an embodiment of the monolithic SAW duplexer according to the present invention.

The SAW duplexer according to the present invention is formed upon a piezo-electric substrate 100 which is made of a piezo-electric material such as quartz, LiTaO$_3$, LiNbO$_3$ and the like. A transmitting bonding pad 110 receives transmission signals from a transmitting power amplifier. A transmitting resonator 120 consists of SAW devices such as reflector arrays 123 and 124, an input transducer array 121 and an output transducer array 122 which are formed upon the piezo-electric substrate 100. The input transducer array 121 of the transmitting resonator 120 is connected to a transmitting bonding pad 110.

A micro strip line 130 allows only the signals of the transmission frequency band (the output of the output transducer array 122) to be passed so as to output them through an input/output bonding pad 140 to an antenna ANT.

The signals which are received to the antenna ANT are inputted through the input/output bonding pad 140 to an input transducer array 151 of a band pass filter 150 which is a SAW device. Thus, only the signals of the reception frequency band are passed, so that the transmission signals would be removed, and that the signals would be outputted from an output transducer array 152 to a receiving resonator 160.

The receiving resonator 160 receives reception signals from the band pass filter 150 through an input transducer array 161, and allows only the signals of the reception frequency band to be passed so as to output them from an output transducer array 162 through a receiving bonding pad 170 to a receiving amplifier.

A ground pattern 190 is formed between the transmitting resonator 120 and the receiving resonator 160, and a ground bonding pad 180 is formed near the left edge, in such a manner that they are connected to a ground terminal of the mobile communication system, thereby forming a ground. Further, sound absorbing members 200 are installed between the transmitting resonator 120, the receiving resonator 160 and the band pass filter 150, thereby removing the surface acoustic waves which propagate through them.

Figure 5:
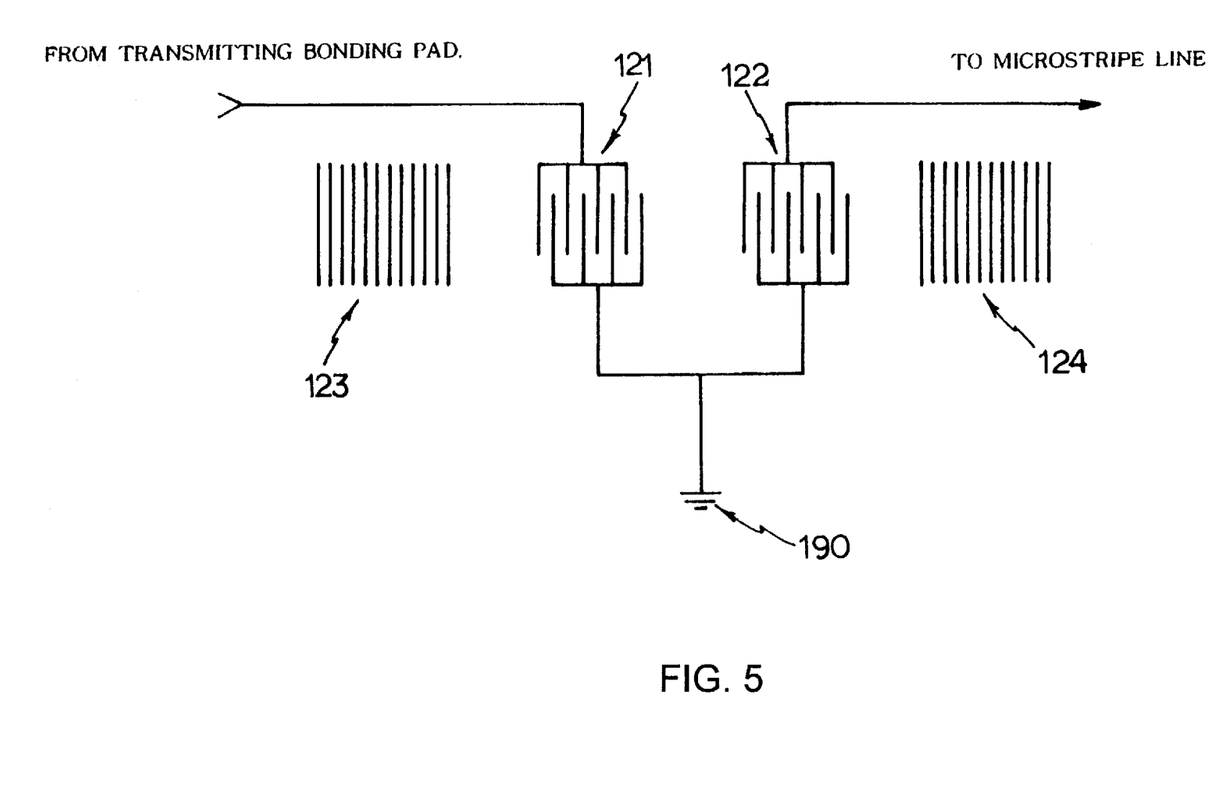
FIG. 5 illustrates a transmitting resonator formed by a SAW device according to the present invention.

FIG. 5 illustrates the transmitting resonator 120 formed by a SAW device according to the present invention.

As shown in FIG. 5, the transmitting resonator 120 includes a pair of reflector arrays 123 and 124, an input Transducer array 121 and an output transducer array 122. Transmission signals F$_1$ which are outputted from a transmitting amplifier (not shown in the drawing) are transferred through the Transmitting bonding pad 110 to the input transducer array 121. These signals are converted into surface acoustic waves by the input transducer array 121, and repeat reflections between the reflector arrays 123 and 124, until they reach a saturation state. Then the signals are transferred through the output transducer array 122 to the microstrip line 130.

Owing to the geometrical structure, the microstrip line 130 has an inductance component and a capacitance component, so that it can serve as an LC filter. In the present invention, the microstrip line 130 serves as a filter for smoothly passing the signals of the transmission frequency, owing to its geometric structure. After passing through the micro-strip line 130, the transmission signals pass from the input/output bonding pad 140 to the antenna ANT so as to be radiated into the air.

Meanwhile, in order to transfer the received signals from the antenna ANT to the receiving device, the bonding pad 140, the band pas filter 150 and the receiving resonator 160 are connected between the antenna ANT and the receiving device. Therefore, if the band pass filter 150 consists of the microstrip line as in the conventional technique, then the transmission signals cannot be completely removed. Therefore, as mentioned above, the high power transmission signals cannot be completely prevented from returning to the receiving section, and therefore, the weak reception signals are adversely affected, with the result that the receiving sensitivity is aggravated, or that the receiving becomes impossible.

However, as shown in FIG. 5, according to the present invention, the band pass filter 150 includes an input transducer array 151 and an output transducer array 152. The input transducer array 151 is connected to the input/output bonding pad 140 to receive reception signals from the antenna ANT so as to convert them into surface acoustic waves. Then the signals are converted into electrical reception signals by the output transducer array 152 so as to be inputted into the receiving resonator 160.

The receiving resonator 160 has the same constitution as that of the transmitting resonator 120 of FIG. 5. That is, as shown in FIG. 4, the receiving resonator 160 includes a pair of reflector arrays 163 and 142, an input transducer array 161 and an output transducer array 162.

Reception signals $F_2$ are transferred via a connection 105 from the output transducer array 152 of the band pass filter 150 to the input transducer array 161, and then, the signals are converted into surface acoustic wave by the input transducer array 161. Then the signals are subjected to repetition of reflections between the reflector arrays 163 and 142 until they reach the saturation state. Then they are transferred through the output transducer array 162 and the receiving bonding pad 170 to a low noise amplifier (not shown in the drawings).

In manufacturing the monolithic SAW duplexer according to the present invention, the devices including the transmitting bonding pad 110, the transmitting resonator 120, the microstrip line 130, the input/output bonding pad 140, the band pass filter 150, the receiving resonator 160, the receiving bonding pad 170, the ground bonding pad 180 and the ground pattern 190 are formed upon an single piezo-electric substrate 100 through a single process.

That is, the manufacturing process for the monolithic SAW duplexer according to the present invention includes the steps of: preparing a mask; and manufacturing the monolithic SAW duplexer by using the mask.

First, the mask manufacturing step for the monolithic SAW duplexer will be described.

Figure 6A:
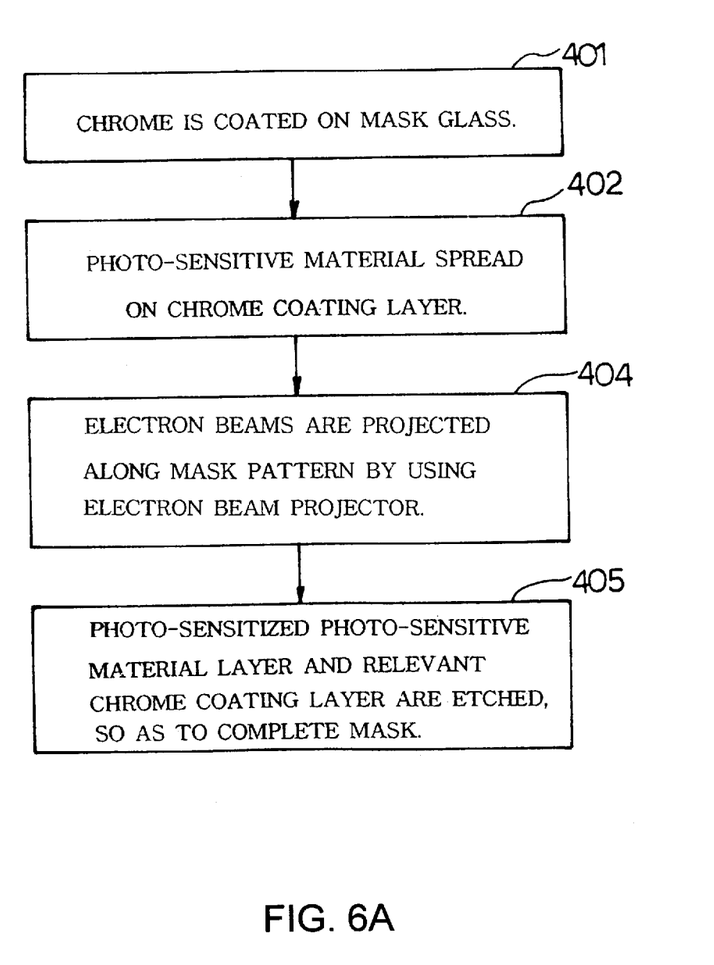
FIG. 6a is a flow chart showing the process for manufacturing the mask.
Figure 6B:
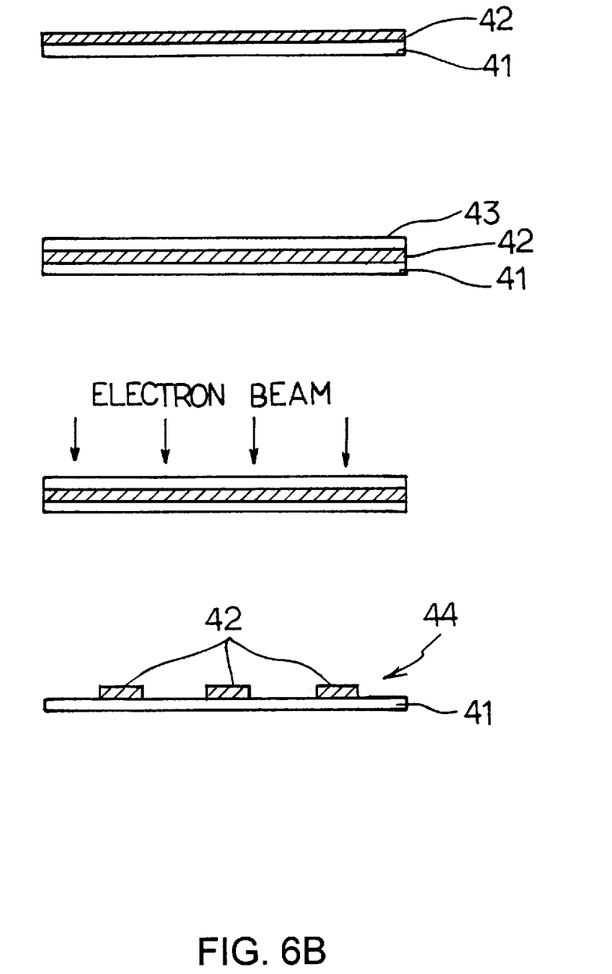
FIG. 6b illustrates the process for manufacturing the mask.
Figure 6C:
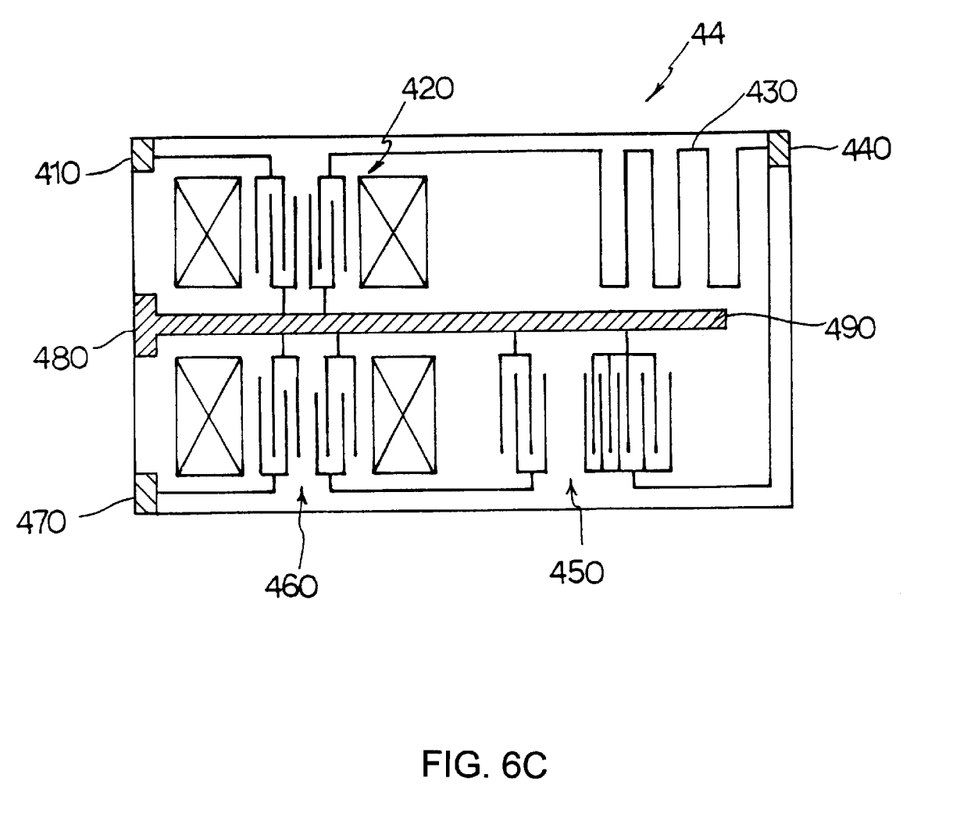
FIG. 6c illustrates the structure of the manufacture.

FIGS. 6a, 6b and 6c illustrate the steps of manufacturing the mask for the monolithic SAW duplexer according to the present invention. FIG. 6a is a flow chart showing the process for manufacturing the mask, and FIG. 6b illustrates the sequence for manufacturing the mask.

At a step 401, a chrome coating layer 42 is formed on a glass 41 for making a mask (refer to FIG. 6b (1)). At a step 402, a photo-sensitive agent 43 is spread on the chrome coating layer 42 for electron beams (refer to FIG. 6b (2)). At a step 404, electron beams are projected along a mask pattern by using an electron beam projector (FIG. 6b (3)). At a step 405, the photo-affected portions of the photo-sensitive agent together with the relevant portions of the chrome coating layer are melted off, thereby completing the mask 44 (refer to FIG. 6b (4)).

FIG. 6c illustrates the completed mask for the monolithic SAW duplexer.

A transmitting bonding pad pattern 410 for forming the transmitting bonding pad 110 is formed on the left upper corner. A transmitting resonator pattern 420 for forming the transmitting resonator 120 is formed connected to the transmitting bonding pattern 410, and its output transducer array pattern is connected to a microstrip line pattern 430 for forming the microstrip line 130. An input/output bonding pad pattern 440 for forming the input/output bonding pad 140 is formed on the right upper corner.

A pattern 450 for forming the band pass filter 150 is formed connected to the input/output bonding pad pattern 440 and beneath the microstrip line pattern 430. A receiving resonator pattern 460 for forming the receiving resonator 160 is formed connected to the band pass filter pattern 450 and to the left side of it. A receiving bonding pad pattern 470 is formed connected to the receiving resonator pattern 460 and on the left lower corner. A ground bonding pad pattern 480 for forming the ground bonding pad 180 is formed near the middle of the left edge. A receiving resonator pattern 460 and a band pass filter pattern 450 are formed respectively below the transmitting resonator pattern 420 and the microstrip line pattern 430. Between them, there is formed a ground pattern 490 for forming the ground terminal 190.

The above layout and structure can be modified in accordance with the functions and needs.

By using the mask 44 which is manufactured in the above described manner, the monolithic SAW duplexer according to the present invention is manufactured in the following manner.

Figure 7A:
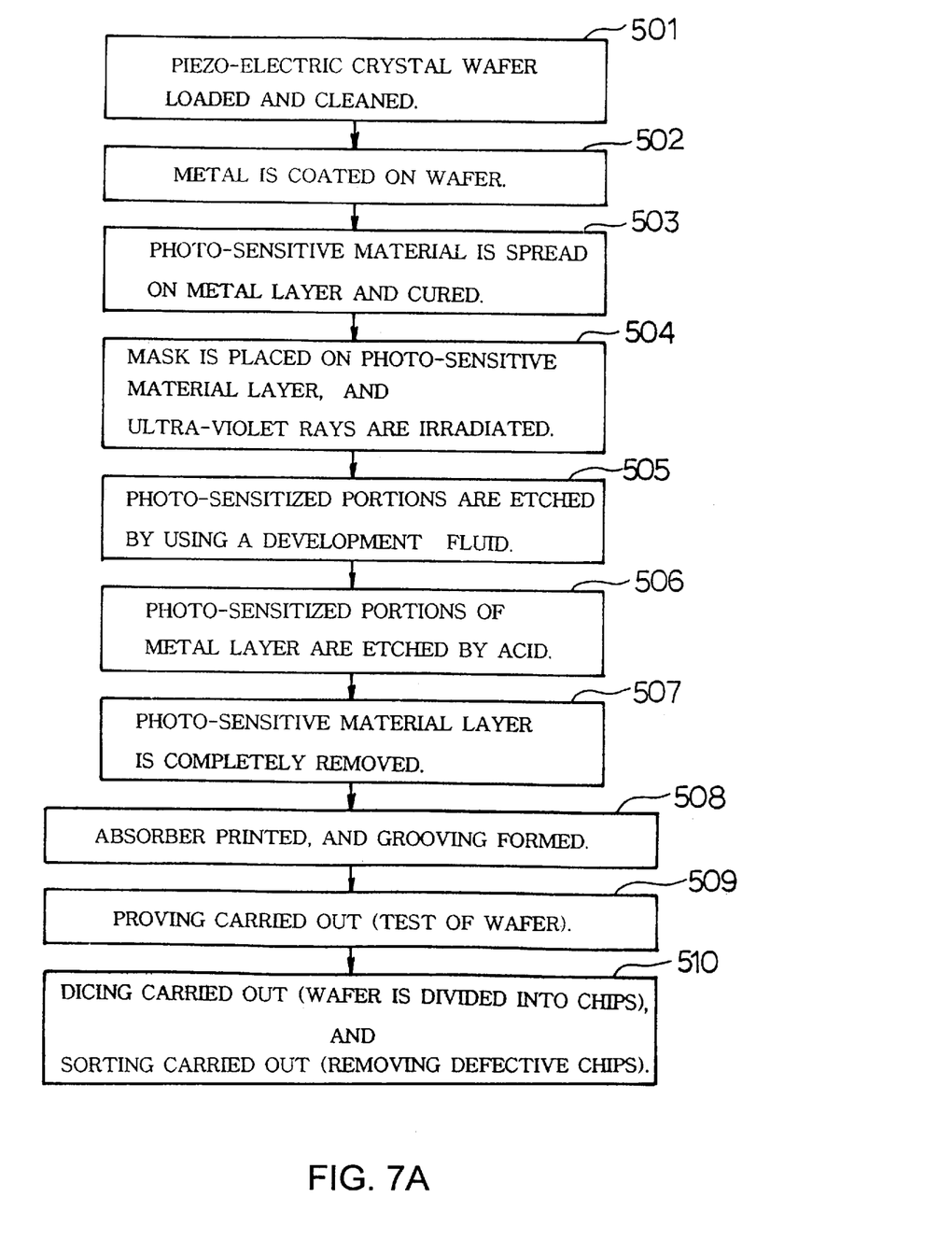
FIG. 7a is a flow chart showing the process for manufacturing the monolithic SAW duplexer according to the present invention.
Figure 7B:
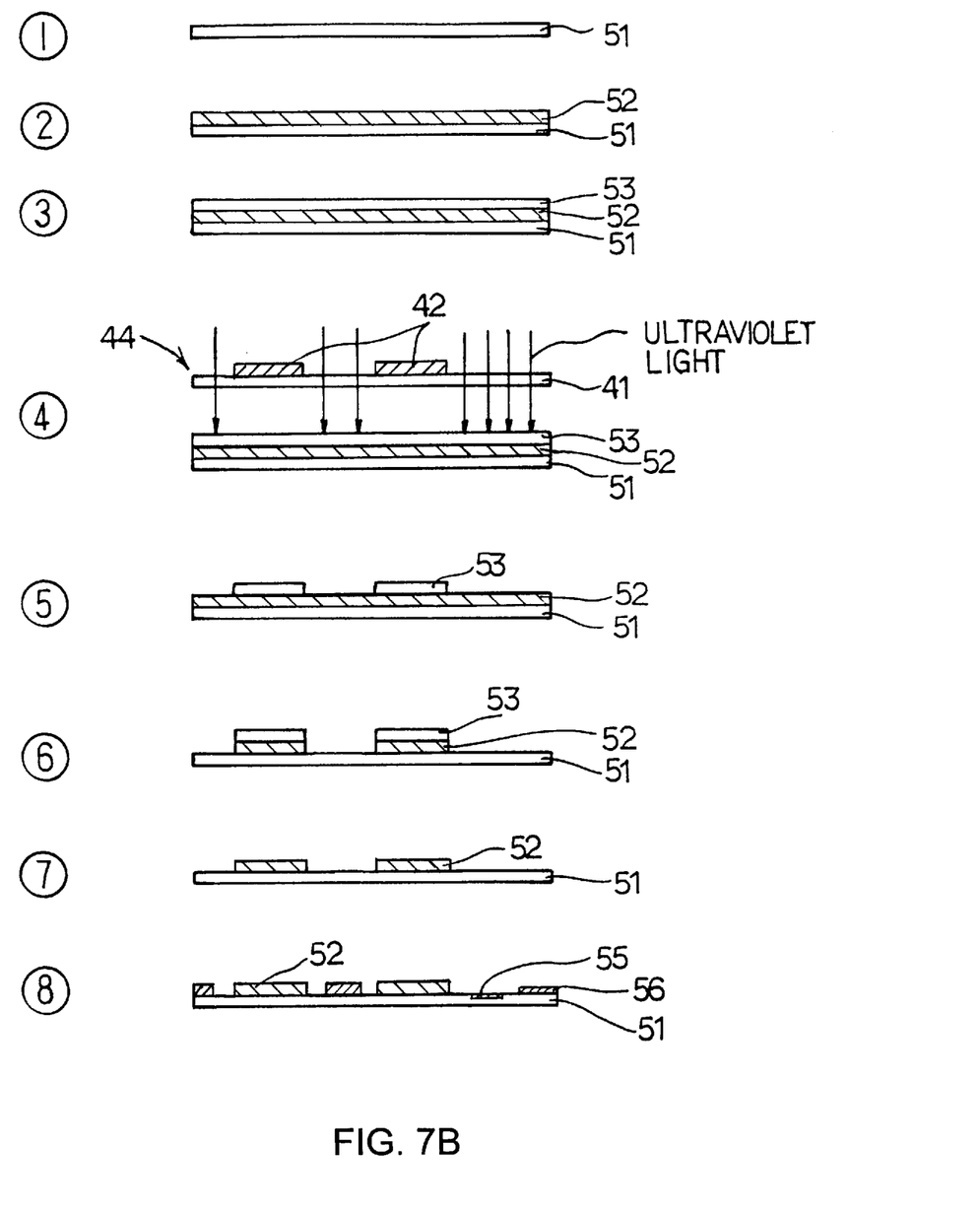
FIG. 7b illustrates the process for manufacturing the monolithic SAW duplexer according to the present invention.

FIG. 7a is a flow chart showing the process for manufacturing the monolithic SAW duplexer according to the present invention, and FIG. 7b illustrates the process for manufacturing the monolithic SAW duplexer according to the present invention.

At a step 501, a piezo-electric crystal wafer 51 is slashed and loaded (refer to FIG. 7b (1)). At a step 502, a metal layer 52 is coated on the wafer 51 (refer to FIG. 7b (2)). At a step 503, a photo-sensitive material 53 is coated on the metal layer 52 (refer to FIG. 7b (3)). At a step 504, the mask 44 is placed on the photo-sensitive material layer 53 of the wafer 51, and ultraviolet rays are irradiated, so that the irradiated portions would becomes apt to be melted (refer to FIG. 7 (4)). At a step 505, the portions which were irradiated with the ultra-violet rays are melted off by spreading a development fluid (refer to FIG. 7b (5)). At a step 506, the portions of the metal layer which are not covered with the photo-sensitive material are removed by using an acid (refer to FIG. 7b (6)). At a step 507, the remaining portions of the photo-sensitive material layer 53 are completely removed (refer to FIG. 7b (7)). At a step 508, a groove 55 is formed by using for example an argon ion beam gun, and a sound absorber 56 is printed.

The absorber 56 is spread on the ground pattern. The sound absorber 56 is made of a sticking polymer, and is cured by heating it or by irradiating ultra-violet rays. The spreading thickness should be preferably 20–30 $\mu$m. The spread width of the absorber should not intrude into the regions of the transmitting resonator and the receiving resonator.

The sound absorber 56 should be a sticking liquid, and its spreading area should be wide. Therefore, the sound absorber 56 cannot be used in a case where a precision is required. In this case, only the groove 55 can be formed. However, if only the groove 55 is used, the efficiency for removing the surface acoustic waves is lowered, and therefore, in the case where a high efficiency is required, only the sound absorber 56 can be used or both the groove 55 and the absorber 56 can be used (refer to FIG. 7b (8)). At a step 509, a test is carried out by using a probe. At a step 510, a dicing is carried out by cutting the wafer 51 into chips, and a sorting is carried out to separate defective products before carrying out an assembling.

The transmitting SAW filter and the receiving SAW filter are formed by a single chip as described above, but the monolithic SAW duplexer according to the present invention is not limited to this, but a plurality of the transmitting filters and a plurality of the receiving filters can be formed by each chip. Further, the number of the transmitting SAW filters does not have to be exactly equal to the number of the receiving SAW filters, but the number of the transmitting SAW filters and the number of the receiving SAW filters can be properly determined within a limit of satisfying the frequency characteristics.

Figure 8:
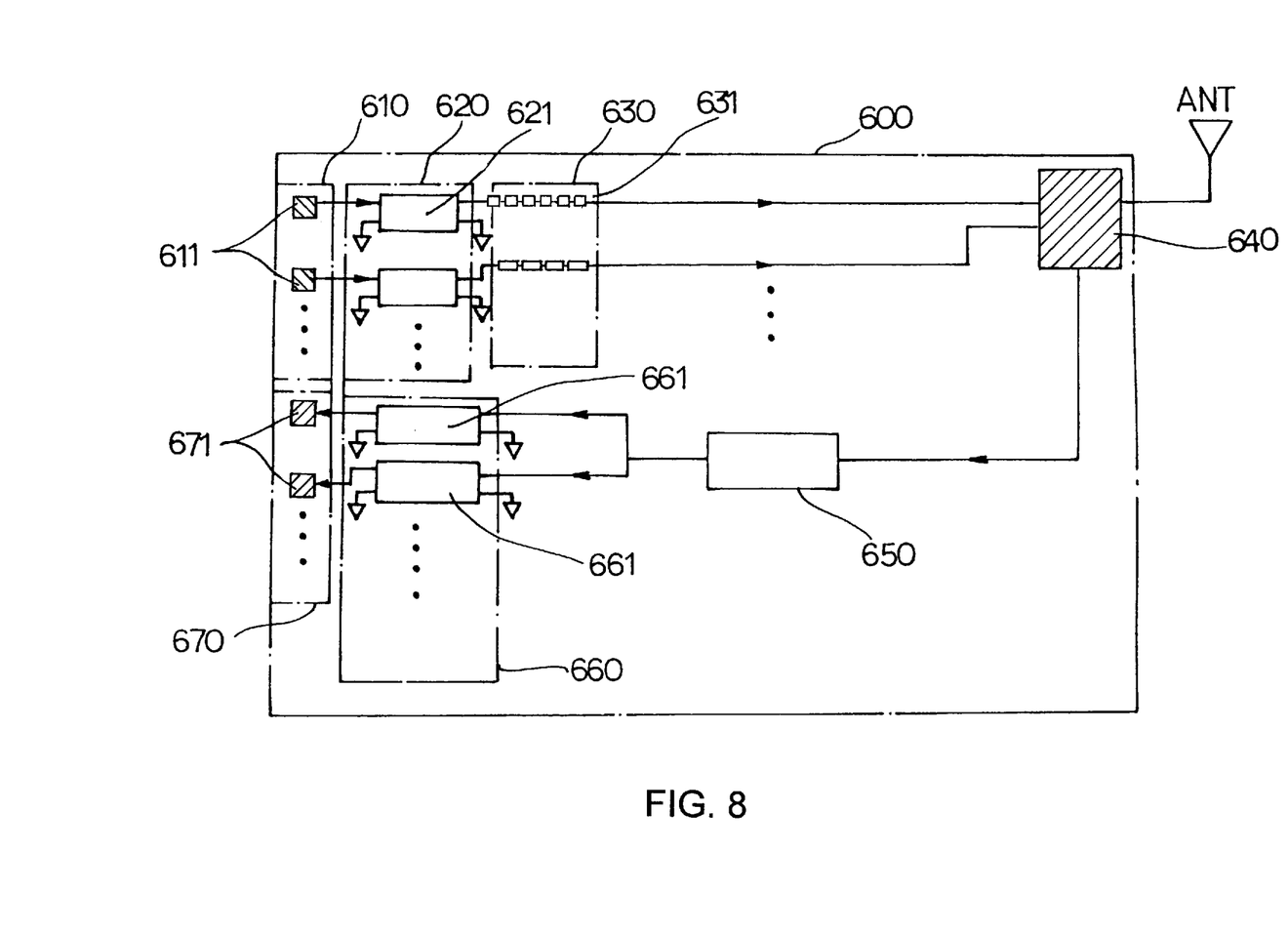
FIG. 8 illustrates an example of the monolithic SAW duplexer including a plurality of transmitting SAW filters and receiving SAW filters so as to use it in a multi-channel system.

FIG. 8 illustrates an example of the monolithic SAW duplexer including a plurality of transmitting SAW filters and receiving SAW filters so as to use it in a multi-channel system.

The monolithic SAW duplexer 600 of FIG. 8 includes: a transmitting bonding pad section 610 including a plurality of transmitting bonding pads 611, 611, . . . ; a transmitting resonator section 620 including a plurality of transmitting resonators 621, 621, . . . formed by SAW devices and having different frequency characteristics; a microstrip line section 630 including a plurality of microstrips 631, 631, . . . by connected to the plurality of transmitting resonators and having different frequency characteristics; an input/output bonding pad 640 connected to the plurality of the microstrip lines 631, 631, . . . , for transferring their signals to an antenna ANT and for outputting the signals of the antenna ANT; a band pass filter 650 formed by a SAW device, for receiving output signals of the input/output bonding pad 640 to allow only the signals of the reception frequency band to be passed; a receiving resonator section 660 including a plurality of receiving resonators 661, 661, . . . for receiving output signals of the band pass filter 650 to output only the signals corresponding to the relevant frequency characteristics; and a receiving bonding pad section 670 including a plurality of receiving bonding pads 671, 671, . . . respectively connected to the plurality of the receiving resonators 661, 661, . . . of the receiving resonator section 660, for outputting the signals to an amplifier of the receiving section.

The transmitting bonding pads 611 respectively receive the output signals of the relevant power amplifiers so as to output the signals to the transmitting resonators 621. The transmitting resonators 621 output only the relevant frequency of a particular channel, and the output is supplied through the relevant microstrip line 631 to the input/output bonding pad 640 so as to be radiated into the air through the antenna ANT. Accordingly, signals of a plurality of channels can be transmitted.

The signals which are received through the antenna ANT are supplied through the input/output bonding pad 640 to the band pass filter 650 so as to be inputted into the receiving resonator section 660. Since the receiving resonator section 660 includes a plurality of the receiving resonators 661, 661 . . . respectively having different frequency characteristics, the reception signals corresponding to the frequency characteristics are supplied through the receiving bonding pads 671 to the receiving section.

According to the present invention as described above, the duplexer having the transmitting filter, the receiving filter, the band pass filter and the like is formed upon a single substrate and in a single chip, and therefore, the duplexer is manufactured in a single process, with the result that the manufacturing process is simplified. Accordingly, the defect rate is reduced, and the manufacturing cost is saved. Further, since a plurality of devices can be formed in a single chip, the duplexer becomes compact, and the separation between the transmission and reception frequencies can be improved.

What is claimed is:

1. A monolithic SAW duplexer comprising:

a piezo-electric substrate;

transmitting and receiving resonators formed by SAW devices upon said piezo-electric substrate;

a microstrip line for allowing pass-through of signals of a frequency band of a transmitting filter so as to output the signals to an antenna; and a transmission signal removing filter formed by a SAW device for allowing pass-through of signals of a receiving band to remove transmission signals of a receiving band to remove transmission signals before outputting the signals to said receiving resonator, wherein a ground pattern is disposed between said transmitting resonator and said receiving resonator, and a sound absorbing means is installed upon said ground pattern.

2. The monolithic SAW duplexer as claimed in claim 1, wherein said sound absorbing means is a polymeric synthetic resin.

3. The monolithic SAW duplexer as claimed in claim 2, wherein said polymeric synthetic resin has a thickness of 20–30 $\mu$m.

4. The monolithic SAW duplexer as claimed in claim 2, wherein said polymeric synthetic resin is spread within a range not intruding regions of reflector arrays and an active region of said transmitting resonator and said receiving resonator.

5. A monolithic SAW duplexer comprising:

a transmitting bonding pad section including a plurality of transmitting bonding pads;

a transmitting resonator section including a plurality of transmitting resonators formed by SAW devices and having different frequency characteristics;

a microstrip line section including a plurality of microstrips connected to the plurality of transmitting resonators and having different frequency characteristics;

an input/output bonding pad connected to the plurality of said microstrip lines, for transferring their signals to an antenna ANT and for outputting signals of said antenna ANT;

a band pass filter formed by a SAW device, for receiving output signals of said input/output bonding pad to allow only signals of a reception frequency band to be passed;

a receiving resonator section including a plurality of receiving resonators for receiving output signals of said band pass filter to output only signals corresponding to relevant frequency characteristics; and a receiving bonding pad section including a plurality of receiving bonding pads respectively connected to the plurality of said receiving resonators of said receiving resonator section, for outputting the signals to an amplifier of a receiving section, wherein the above components are formed upon a single piezo-electric substrate.

* * * * *